US012690317B2

(12) United States Patent
Emberger et al.

(10) Patent No.: US 12,690,317 B2
(45) Date of Patent: Jul. 21, 2026

(54) LIGHTING DEVICE

(71) Applicant: AIRSTAR SAS, Le Champ-Pres-Froges (FR)

(72) Inventors: Simon Emberger, Le Champ-Pres-Froges (FR); Adrien Dupuis, Le Champ-Pres-Froges (FR); Florian Watelet, Le Champ-Pres-Froges (FR); Sébastien Francois, Le Champ-Pres-Froges (FR)

(73) Assignee: AIRSTAR SAS, Le Champ-Pres-Froges (FR)

( * ) Notice: Subject to any disclaimer, the term of this patent is extended or adjusted under 35 U.S.C. 154(b) by 464 days.

(21) Appl. No.: 18/253,468

(22) PCT Filed: Oct. 5, 2021

(86) PCT No.: PCT/EP2021/077336
§ 371 (c)(1),
(2) Date: May 18, 2023

(87) PCT Pub. No.: WO2022/106108
PCT Pub. Date: May 27, 2022

(65) Prior Publication Data
US 2023/0411437 A1 Dec. 21, 2023

(30) Foreign Application Priority Data
Nov. 23, 2020 (FR) ...................................... 20/12025

(51) Int. Cl.
H10H 29/10 (2025.01)
F21K 9/238 (2016.01)
(Continued)

(52) U.S. Cl.
CPC ............. H10H 29/10 (2025.01); F21K 9/238 (2016.08); H05B 45/30 (2020.01); H05B 45/50 (2020.01)

(58) Field of Classification Search
CPC ........ H10H 29/10; F21K 9/238; H05B 45/50; H05B 45/30
See application file for complete search history.

(56) References Cited

U.S. PATENT DOCUMENTS

| | | | | |
|---|---|---|---|---|
| 11,982,427 B2 * | 5/2024 | Meyer | ................... | F21V 19/003 |
| 2010/0219758 A1 * | 9/2010 | Melzner | ................... | F21K 9/00 |
| | | | | 315/312 |

(Continued)

FOREIGN PATENT DOCUMENTS

| | | |
|---|---|---|
| EP | 3321568 A1 | 5/2018 |
| JP | 2004296196 A | 10/2004 |

(Continued)

OTHER PUBLICATIONS

International Search Report and Written Opinion (with translation) for PCT/EP2021/077336 mailed Dec. 14, 2021.

(Continued)

*Primary Examiner* — Christopher E Dunay
(74) *Attorney, Agent, or Firm* — Perilla Knox & Hildebrandt LLP; Jason M. Perilla

(57) ABSTRACT

The present description concerns a lighting device comprising:
    an electrically-conductive support structure (130); and
    a plurality of elementary lighting modules (110) fastened to the support structure, each elementary module comprising a printed circuit board and, assembled on the printed circuit board, a LED assembly and an electronic circuit for powering and controlling the LED assembly, wherein, in each elementary module (110), the printed circuit board of the module comprises at least one reference (Continued)

terminal, the reference terminals of the printed circuit boards of the different elementary modules being electrically connected to one another via the support structure (130).

12 Claims, 12 Drawing Sheets

(51) Int. Cl.
    *H05B 45/30*         (2020.01)
    *H05B 45/50*         (2022.01)

(56)                References Cited

U.S. PATENT DOCUMENTS

| | | |
|---|---|---|
| 2012/0182739 A1 | 7/2012 | Leung et al. |
| 2018/0168009 A1* | 6/2018 | Bobbo ................... H05K 1/181 |
| 2019/0341718 A1 | 11/2019 | Yu |
| 2023/0073441 A1* | 3/2023 | Bocock ................ F21V 23/002 |
| 2025/0202164 A1* | 6/2025 | Lara-Cabeza ...... H01R 13/7175 |

FOREIGN PATENT DOCUMENTS

| | | |
|---|---|---|
| JP | 3175640 U | 5/2012 |
| JP | 2014082067 A | 5/2014 |
| JP | 2014089888 A | 5/2014 |

OTHER PUBLICATIONS

Notice of Reasons for Rejection for Japanese Application No. 2023-531637 mailed Jul. 29, 2025.

* cited by examiner

LIGHTING DEVICE

The present application is a 35 U.S.C. § 371 national stage patent application of Patent Cooperation Treaty application number PCT/EP2021/077336, filed Oct. 5, 2021, titled "LIGHTING DEVICE," which claims the benefit of priority to French patent application FR2012025 filed on Nov. 23, 2020 and entitled "Dispositif d'éclairage", the entire contents of each of which applications is hereby incorporated herein by reference.

TECHNICAL BACKGROUND

The present disclosure generally concerns lighting devices, and more particularly aims at a modular lighting device with light-emitting diodes (LED). The present disclosure further concerns the field of lighting balloons with an inflatable envelope, and, more particularly, the control of the inflation of the envelope in such balloons.

PRIOR ART

Many lighting devices with LEDs have already been provided. It would however be desirable to be able to have a lighting device with LEDs overcoming all or part of the disadvantages of known devices. In particular, it would be desirable to be able to have a more reliable lighting device with LEDs, simpler to assemble, simpler to repair, and/or having additional functionalities with respect to known devices.

It would however be desirable to be able to improve the control of the inflation of the envelope in lighting devices of inflatable balloon type.

SUMMARY OF THE INVENTION

For this purpose, an embodiment provides a lighting device comprising:
  an electrically-conductive support structure; and
  a plurality of elementary lighting modules fastened to the support structure, each elementary module comprising a printed circuit board and, assembled on the printed circuit board, a LED assembly and an electronic circuit for powering and controlling the LED assembly,
wherein, in each elementary module, the printed circuit board comprises at least one reference terminal, the reference terminals of the printed circuit boards of the different elementary modules being electrically connected to one another via the support structure.

According to an embodiment, each elementary module comprises a support for fastening the module to the support structure.

According to an embodiment, in each elementary module, the support for fastening the module comprises an electrically-conductive part electrically connecting a reference terminal of the printed circuit board of the module to the support structure.

According to an embodiment, the electrically-conductive part comprises a conductive rod provided at its ends with conductive tabs, each comprising an opening crossed by a conductive rod of the support structure.

According to an embodiment, each elementary module further comprises a transparent or translucent protection casing placed in front of the printed circuit board of the module, the protection casing being fastened to said module fastening support.

According to an embodiment, the elementary modules are arranged according to one or a plurality of prism-shaped stages, the modules being arranged on the lateral surfaces of the prism.

According to an embodiment, the elementary modules are arranged according to a planar layout.

According to an embodiment, the elementary modules are arranged according to a plurality of columns, each comprising a plurality of elementary modules, each module comprising two power supply and control connectors, and the elementary modules of a same column are connected in a chain via their respective power supply and control connectors.

According to an embodiment, the device further comprises an electronic power supply and control circuit connected to an end of each column.

According to an embodiment, the electronic power supply and control circuit is configured to implement a diagnosis method comprising a step of measurement of a quantity representative of a current consumed by a column and/or of a voltage across a column of elementary modules.

According to an embodiment, the electronic power supply and control circuit is configured to implement a diagnosis method comprising the following steps:
  a) controlling an elementary module of a column to the on state and measuring a value representative of the current flowing through the column;
  b) controlling said elementary module of said column to the off state and measuring a value representative of the current flowing through the column; and
  c) comparing the difference between the value measured at step a) and the value measured at step b) with a nominal reference value and, if the interval between said difference and said nominal reference value exceeds a determined margin, deducing therefrom that said elementary module is defective.

According to an embodiment, the device comprises a diffusing envelope surrounding the support structure and the elementary modules.

According to an embodiment, the diffusing envelope is an inflatable envelope.

Another embodiment provides a lighting device comprising:
  a lighting structure;
  an inflatable envelope surrounding the lighting structure;
  an inflation fan adapted to ensuring the inflation of the envelope; and
  an electronic control circuit configured to, during a phase of inflation of the envelope, monitor the rotation speed of the inflation fan, detect an increase of said rotation speed corresponding to the fan starting to cavitate at the end of the inflation phase, and, when said increase is detected, decrease the value of a power set point applied to the fan.

According to an embodiment, the inflation fan comprises a rotation speed sensor coupled to the electronic control circuit.

According to an embodiment, the electronic control circuit is configured to, during the inflation phase, control the inflation fan at its maximum power.

According to an embodiment, the control circuit is further configured to measure the time elapsed since the beginning of the inflation phase and, if the elapsed time reaches, before the detection of the fan starting to cavitate, a predefined threshold corresponding to a maximum nominal inflation time, emitting a signal for warning a user that the inflatable envelope is leaky.

According to an embodiment, for the emission of the warning signal, the control circuit commands the flashing of at least one light source of the lighting structure according to a predetermined sequence, and/or the sending of a warning message to a distant terminal via a wired or wireless communication channel.

According to an embodiment, the electronic control circuit is further configured to, during or outside of the inflation phase:

apply a power set point to the inflation fan;

determine the rotation speed of the inflation fan, and compare said rotation speed with a predefined threshold corresponding to a nominal rotation speed for said power set point; and if said rotation speed is greater than said threshold, emit a warning signal indicating the clogging of an intake filter of the fan.

According to an embodiment, the lighting structure comprises:

a support structure; and a plurality of elementary lighting modules fastened to the metal support structure, each elementary module comprising a printed circuit board and, assembled on the printed circuit board, a LED assembly and an electronic circuit for powering and controlling the LED assembly.

According to an embodiment, in each elementary module, the printed circuit board of the module comprises at least one reference terminal, the reference terminals of the printed circuit boards of the different elementary modules being electrically connected to one another via the support structure.

According to an embodiment, each elementary module comprises a support for fastening the module to the support structure.

According to an embodiment, in each elementary module, the module fastening support comprises a conductive part electrically connecting a reference terminal of the printed circuit board of the module to the metal support structure.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which:

FIG. 8 is a more detailed electric diagram of an example of embodiment of an elementary lighting module of a lighting device with LEDs according to an embodiment;

FIG. 9 illustrates an alternative embodiment of the elementary lighting module of FIG. 8;

DESCRIPTION OF THE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the forming of the LEDs and of the electronic power supply and control circuits of the described devices has not been detailed, the forming of these elements is indeed within the abilities of those skilled in the art based on the indications of the present disclosure.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made, unless specified otherwise, to the orientation of the figures.

Unless specified otherwise, the expressions "around", "approximately", "substantially" and "in the order of" signify within 10%, and preferably within 5%.

Figure 1:
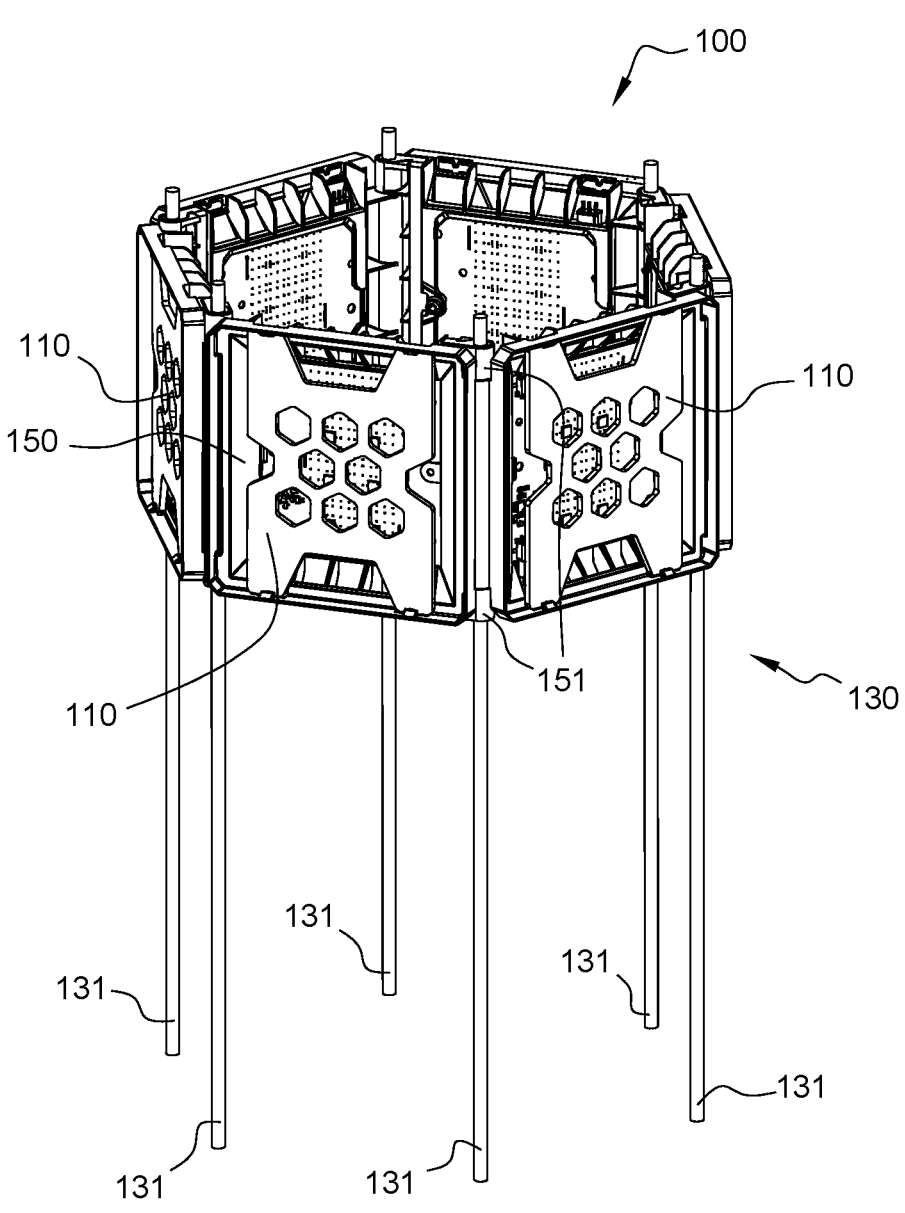
FIG. 1 is a partial perspective view of an example of a lighting structure of a lighting device with LEDs according to an embodiment.

FIG. 1 is a partial perspective view of an example of a lighting structure 100 of a lighting device with LEDs according to an embodiment.

Lighting structure 100 comprises a plurality of elementary lighting modules 110, identical or similar, fastened to a same support structure 130 made of one or a plurality of electrically-conductive materials, for example, of metal, of carbon, or of a carbon-doped polymer material.

In the example of FIG. 1, support structure 130 is intended to receive eighteen elementary modules 110 distributed into three stacked stages of six modules each. For clarity, only the six elementary modules 110 of the upper stage have been shown in FIG. 1.

In this example, each elementary module 110 has the shape of a substantially rectangular or square panel. In each stage, the six elementary modules 110 of the stage are arranged in a hexagonal prism layout. More particularly, the six elementary modules 110 of the stage respectively form the six rectangular surfaces of the hexagonal prism. The different stages are vertically aligned along a same central axis. More particularly, in this example, in each stage of lighting structure 100, each elementary module 110 of the stage is vertically aligned, by its vertical edges, with an elementary module 110 of each other stage.

The support structure 130 of FIG. 1 comprises six vertical rods 131, for example, identical or similar, regularly distributed according to a circular layout (in top view). The rods define the edges of the hexagonal prismatic structure. Rods 131 are made of an electrically-conductive material, for example, metal, carbon, or a carbon-doped polymer material.

Each elementary module 110 comprises a support 150 used to fasten module 110 to support structure 130. In this example, each support 150 has a generally rectangular or square shape and lateral dimensions substantially corresponding to the lateral dimensions of module 110. Each support 150 comprises, on the side of a vertical edge of module 110, one or a plurality of fastening rings 151, intended to be slipped on one of the rods 131 of the support structure. In the shown example, each support 150 comprises two fastening rings 151 respectively arranged at the two ends of a same vertical edge of support 150. When an elementary module 110 is assembled on support structure 130, the fastening ring(s) 151 of the module are crossed by a same rod 131 of the support structure. The vertical edge of support 150 opposite to rings 151 comprises, in the lower portion of the module, an opening crossed by a rod 131 next to the support structure 130. More particularly, in this example, in front view from the outside of the lighting structure, in each elementary module 110, the fastening support 150 of the module comprises, on the side of its right-hand edge, two fastening rings 151 respectively arranged in the upper portion and in the lower portion of the edge of the module, slipped on a rod 131 of support structure 130 and, on the side of its left-hand edge, an opening (not visible in the drawing) crossed by a neighboring rod 131. Thus, in this example, in each stage, each portion of rod 131 defining an edge of the hexagonal prism of the stage:

- on the one hand crosses the fastening rings 151 of the fastening support 150 of a first elementary module 110 of the stage, mostly located on the left-hand side of said rod 131; and
- on the other hand crosses an opening of the bonding support 150 of a second elementary module 110 of the stage, mostly located on the right-hand side of said rod 131.

This layout allows a robust fastening of the elementary modules 110 of each stage on a number of rods 131 equal to the number of elementary modules 110 of the stage. The described embodiments are however not limited to this specific layout.

An advantage of the lighting structure described in relation with FIG. 1 is that it can easily be declined in many other shapes and/or dimensions based on the same elementary base modules 110, by simply adapting the arrangement and/or the number of rods 131 of support structure 130. This enables to span various applications while limiting the device design and manufacturing costs for each new application. In particular, the number of elementary modules 110 may be selected according to the total desired light power. As an example, each elementary module 110 has an emission light power in the range from 1 to 10,000 lumens, for example, from 10 to 5,000 lumens, for example, from 100 to 1,000 lumens. The total emission light power of the device (sum of the powers emitted by the different elementary modules 110) is for example in the range from 50 to 1,000,000 lumens, for example, from 5,000 to 500,000 lumens.

Figures 2, 3:
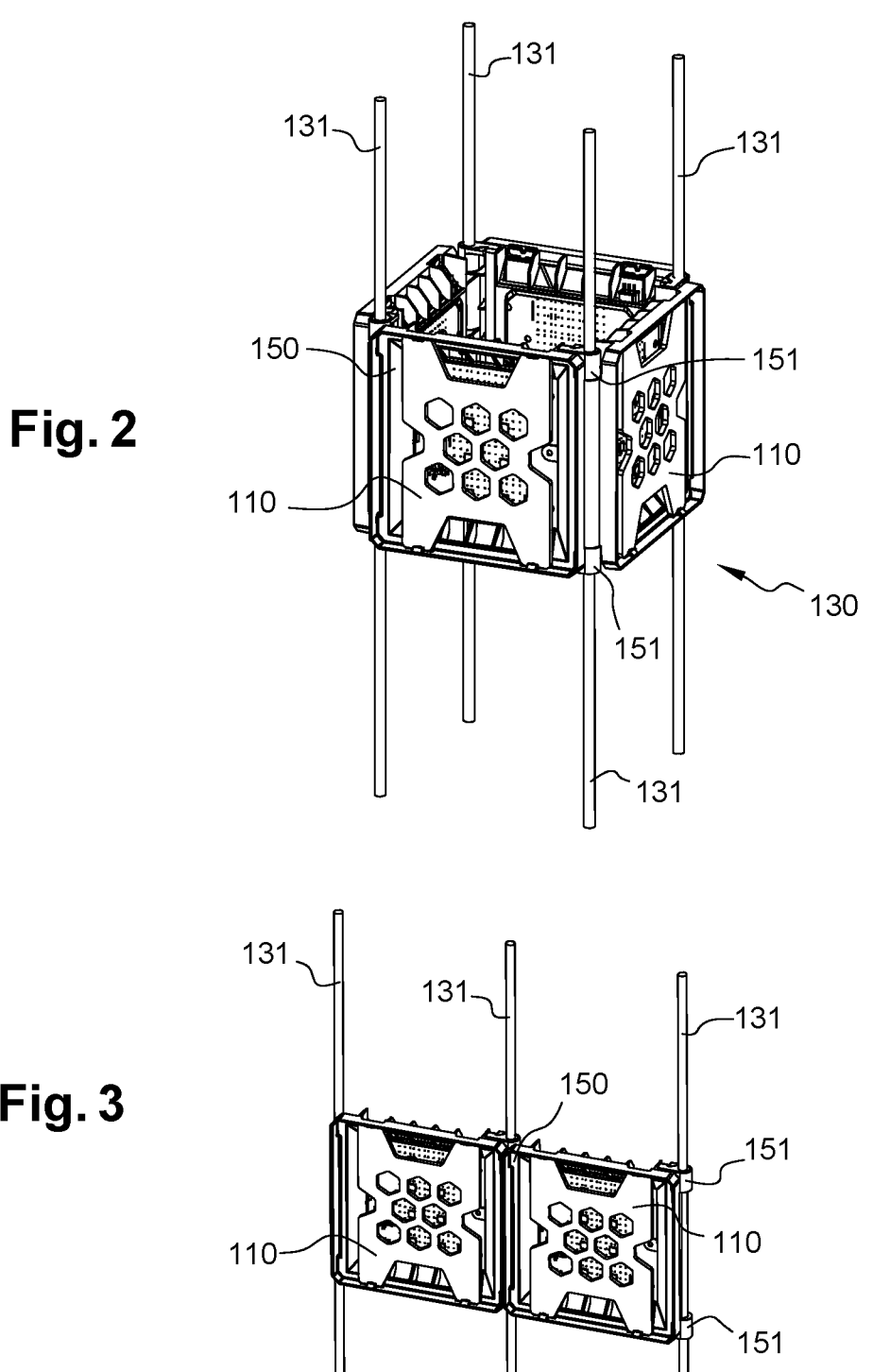
FIG. 2 is a perspective view of another example of a lighting structure of a lighting device with LEDs according to an embodiment.
FIG. 3 is a perspective view of another example of a lighting structure of a lighting device with LEDs according to an embodiment.

FIGS. 2 and 3 illustrate other examples (non-limiting) of possible configurations of a lighting structure of the type described in relation with FIG. 1.

In the example of FIG. 2, the structure comprises four elementary modules 110 per stage, respectively arranged along the four lateral surfaces of a prism with a square base. The support structure comprises four rods 131, respectively defining the four edges of the prism. In the example of FIG. 2, a single stage has been shown. According to the targeted application, the lighting structure may comprise a plurality of vertically stacked stages such as described in relation with FIG. 1.

In the example of FIG. 3, the structure comprises two elementary modules 110 per stage, linearly aligned in a same plane. The support structure comprises three rods 131 linearly aligned in top view. In the example of FIG. 3, a single stage of two modules has been shown. According to the targeted application, the lighting structure may comprise a plurality of vertically-stacked stages as described in relation with FIG. 1 and/or a number of elementary modules 110 per stage different from two (for example a single module per stage or more than two stages per module).

Figure 4:
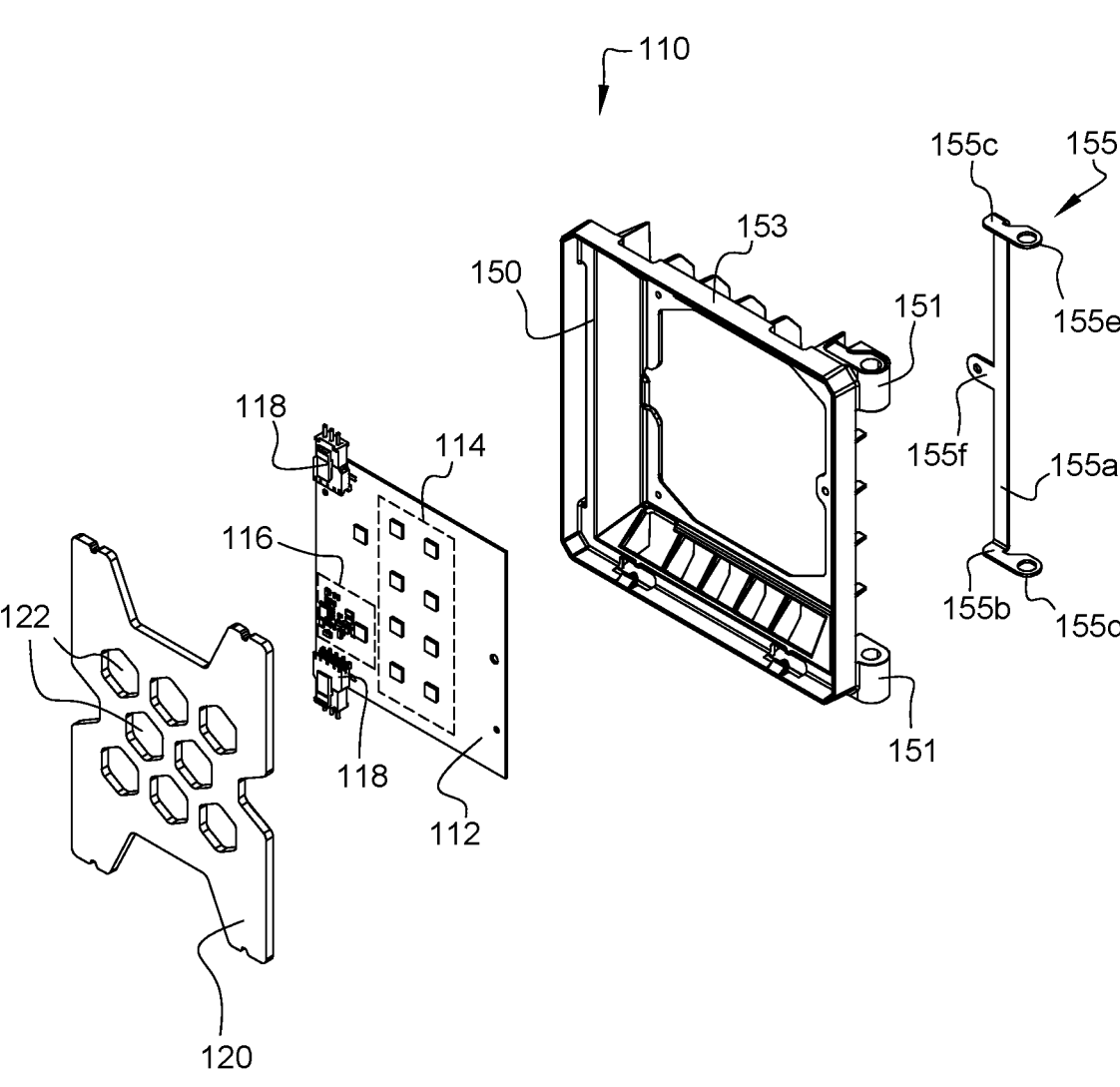
FIG. 4 is an exploded perspective view of an example of an elementary lighting module of a lighting device with LEDs according to an embodiment.

FIG. 4 is an exploded perspective view of an example of an elementary lighting module 110 of a lighting structure of the type described in relation with FIGS. 1, 2, and 3.

Module 110 comprises a printed circuit board 112, having an assembly 114 of one or a plurality of LEDs (eight LEDs regularly distributed on the surface of the printed circuit board in the shown example), and an electronic circuit 116 for powering and controlling the LED assembly. Each module 110 comprises its own printed circuit board 112, separate from those of the other modules 110. Thus, each module 110 forms an elementary lighting panel independent from the other modules. The dimensions of printed circuit board 112 substantially correspond to the dimensions of module 110. As an example, printed circuit board 112 has a generally rectangular or square shape with a length in the range from 50 to 250 mm and a width in the range from 50 to 250 mm.

In the shown example, module 110 further comprises, assembled on the printed circuit board, two connectors 118, for example, identical or similar, intended to connect module 110 to an external device, for example, another module 110 or an electronic circuit for powering and controlling the lighting structure.

In the example of FIG. 4, connectors 118 are respectively arranged on the side of the upper edge and on the side of the lower edge of the module, in the vicinity of the right-hand edge of the module. The described embodiments are however not limited to this specific layout.

Each elementary module 110 further comprises a protection casing 120 arranged in front of the printed circuit board 112 of the module, on the side of the lighting surface of the module. Casing 120 may comprise a transparent or translucent plate, for example made of glass or of a polymer material, having dimensions substantially equal to those of printed circuit board 112, placed parallel to printed circuit board 112, on the side of the surface of printed circuit board 112 having the LEDs 114 of the module assembled thereon. As a variant, protection casing 120 may comprise an opaque wall comprising one or a plurality of openings 122 in front of the surface of printed circuit board 112 on which are assembled the LEDs 114 of the module, for example, as shown in FIG. 4.

Fastening support 150 enables to ensure the installing and the holding in position of printed circuit board 112 on support structure 130 (FIGS. 1 to 3). In this example, protection casing 120 is directly fastened to fastening support 150, for example, by snapping. This enables to directly transmit to support structure 130 possible shocks undergone by protection casing 120, thus limiting the stress undergone by printed circuit board 112.

In this example, fastening support 150 comprises a frame 153, for example, of generally square or rectangular shape, and lateral dimensions substantially corresponding to the lateral dimensions of module 110, intended to receive printed circuit board 112 and, above printed circuit board 112, protection casing 120. Fastening rings 151 are arranged on the side of a vertical edge of frame 153. Frame 153 and fastening rings 151 are for example made of an electrically-insulating material, for example, of plastic. As an example, frame 153 and fastening rings 151 form a monoblock element, for example, formed by molding. On the side of its vertical edge opposite to rings 151, frame 153 may comprise an opening, not shown in the drawings, intended to be crossed by a rod 131.

In this example, fastening support 150 further ensures a function of electric connection of reference connection terminals or areas of printed circuit board 112 to support structure 130. The reference terminals are intended to be connected to a reference potential of the device, for example, the ground or any other reference potential, for example, a positive power supply potential. For this purpose, in this example, support 150 comprises an electrically-conductive part 155, for example metallic, in contact on the one hand with a reference connection terminal (not detailed in FIG. 4) of printed circuit board 112 and on the other hand with the metal rod 131 crossing the fastening rings 151 of support 150. Thus, the reference terminals of the printed circuit boards 112 of the different elementary modules 110 of a same column are all connected to one another via the metal rod 131 crossing the fastening rings 151 of said modules. The different metal rods 131 of support structure 130 may be electrically connected to one another by a coupling part, not shown, of support structure 130, made of an electrically-conductive material. This enables to ensure the equipotential character of the reference terminals of the different modules 110. As an example, the coupling part may be an upper platen and/or a lower platen 133 (visible in FIG. 5) made of an electrically-conductive material. Each platen may comprise openings having conductive rods 131 running therethrough, which enables to ensure the lateral spacing of rods 131 and the electric connection between the different rods 131.

In the shown example, the electrically-conductive part 155 of fastening support 150 comprises a metal rod 155a having a length substantially equal to the height of frame 153. Rod 155a is provided, at each of its ends, with a tab 155b, respectively 155c. Each of tabs 155b and 155c comprises a through opening 155d, respectively 155e, intended to be crossed by the conductive rod 131 crossing the rings 151 for fastening support 150. Thus, conductive rod 131 electrically and mechanically comes into contact with part 155 at the level of the periphery of the openings 155d, 155e of tabs 155b, 155c. Rod 155a is further provided, in a central portion, with a tab 155f intended to be mechanically and electrically placed into contact with a reference terminal of printed circuit board 112.

The assembly of elementary modules 110 and their fastening to support structure 130 may be performed as follows.

Printed circuit boards 112 are prepared upstream of the assembly phase. Printed circuit boards 112 and conductive parts 155 may then be assembled on support frames 153. In each module 110, a clamping screw, not shown, may be provided to ensure the fastening of printed circuit board 112 and of conductive part 155 to frame 153. This screw further enables to ensure a good electric contact between the reference terminal of printed circuit board 112 and the contact tab 155f of conductive part 155. Protection casing 120 may then be snapped on frame 153, above printed circuit board 112.

Elementary modules 110 may then slipped in a column on the conductive rods 131 of support structure 130.

A clamping device (not detailed in the drawing) may be provided at the ends of each rod 131 to ensure the vertical clamping of the elementary modules 110 of each column. As an example, rods 131 are threaded, and the clamping device comprises, for each rod 131, a nut (not detailed in the drawings) screwed on the side of the lower end and/or a nut (not detailed in the drawings) screwed on the side of the upper end of the threaded rod, ensuring the vertical clamping of the column. More generally, any other equivalent clamping system may be provided.

In the above-described example, protection casing 120 is adapted to transmitting the light emitted by the assembly of LEDs 114 with no significant alteration. As a variant, protection casing 120 may have any other desired optical function, for example, a lens function, or a function of orientation of the light in a determined direction (prism).

Figure 5:
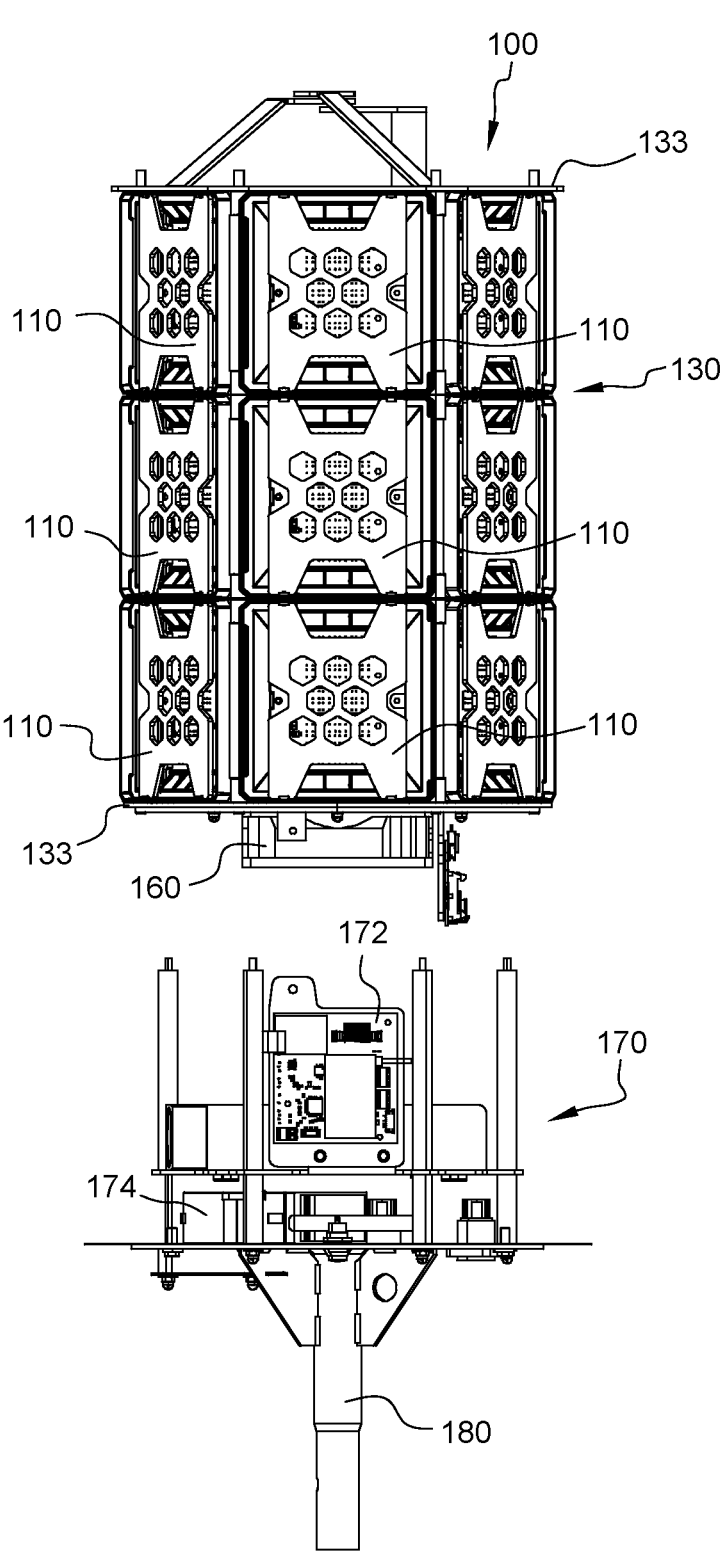
FIG. 5 is a partial front view of an example of a lighting device with LEDs according to an embodiment.

FIG. 5 is a partial exploded front view of an example of a lighting device with LEDs according to an embodiment.

The device of FIG. 5 comprises a lighting structure 100 identical or similar to the structure described in relation with FIG. 1.

The device of FIG. 5 further comprises, fastened under the lower platen 133 of the lighting structure, a fan 160, also called heat fan, intended to stir the air located inside of the volume delimited by elementary modules 110, to ease the dissipation of the heat generated by the LEDs.

The device of FIG. 5 further comprises, fastened under the lower platen 133 of the lighting structure, a service stage 170 particularly comprising electronic circuits for powering and controlling the lighting structure. Service stage 170 may comprise a support structure of the same type as that of the lighting structure. The electronic power supply and control circuits may be assembled on one or a plurality of printed circuit boards 172 fastened to the support structure, for example, by means of fastening supports of the same type as the supports 150 of the lighting structure.

In this example, the lighting device is a device of lighting balloon type, comprising an inflatable envelope, not shown in FIG. 5, enveloping lighting structure 100 and service stage 170.

To allow the inflation of the envelope, the service stage comprises a fan 174, called inflation fan, adapted to sucking in air in the lower portion of the device, to inject it into the envelope.

In the shown example, the device further comprises a support mast 180 fastened to a lower platen of service stage 170.

Figure 6:
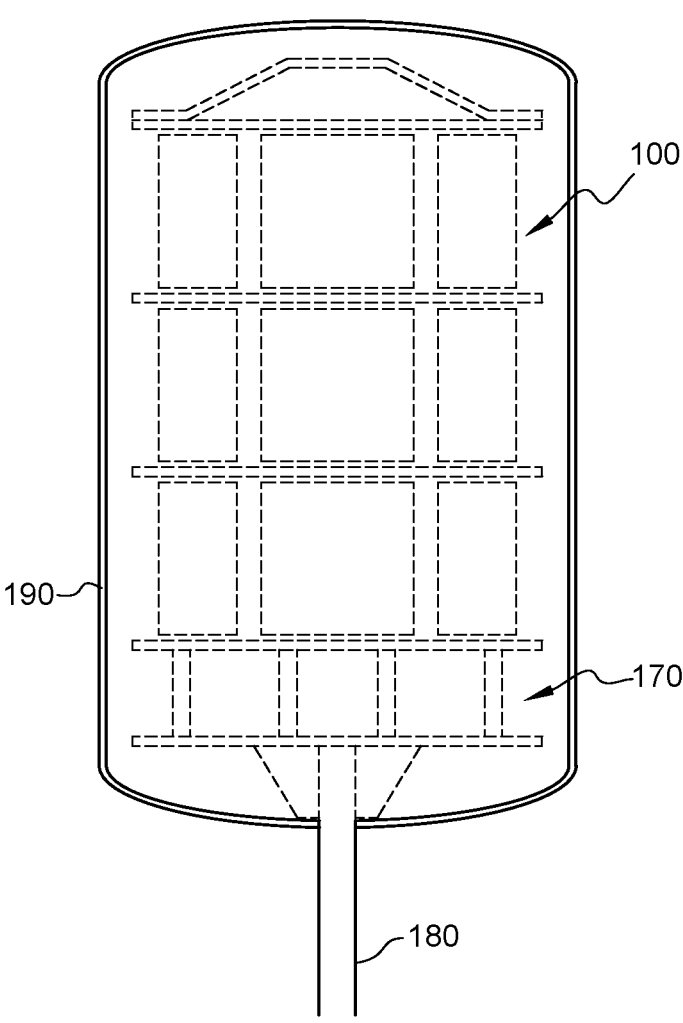
FIG. 6 is a simplified front view of an example of a lighting balloon with an inflatable envelope according to an embodiment.

FIG. 6 is a simplified front view of a lighting balloon with an inflatable envelope of the above-described type.

In FIG. 6, lighting structure 100, service stage 170, and support mast 180 have been schematically shown by dotted lines.

In this example, the lighting device comprises an inflatable 190 surrounding the assembly comprising lighting structure 100 and service stage 170. Envelope 190 is a flexible envelope, for example, a textile envelope. Envelope 190 is preferably tight to water and to air and enables to protect all the mechanical and electronic components of the lighting structure and of the service stage against outer aggressions. Envelope 190 may also play the role of an optical diffuser for the light emitted by the lighting structure. In other words, envelope 190 is adapted to transmitting, by diffusing it, the light emitted by the lighting structure.

The inflation of envelope 190 is ensured by inflation fan 174 (not shown in FIG. 6), at the putting into service of the lighting device.

It should be noted that the above-described lighting structures are not limited to a use in lighting devices of inflatable balloon type. As a variant, inflatable envelope 190 may be replaced with a non-inflatable flexible envelope, for example stretched on a framework (not shown) of the support structure, or also with a rigid envelope or shell. In this case, inflation fan 174 and the associated electronic power supply and control circuits may be omitted.

Figure 7:
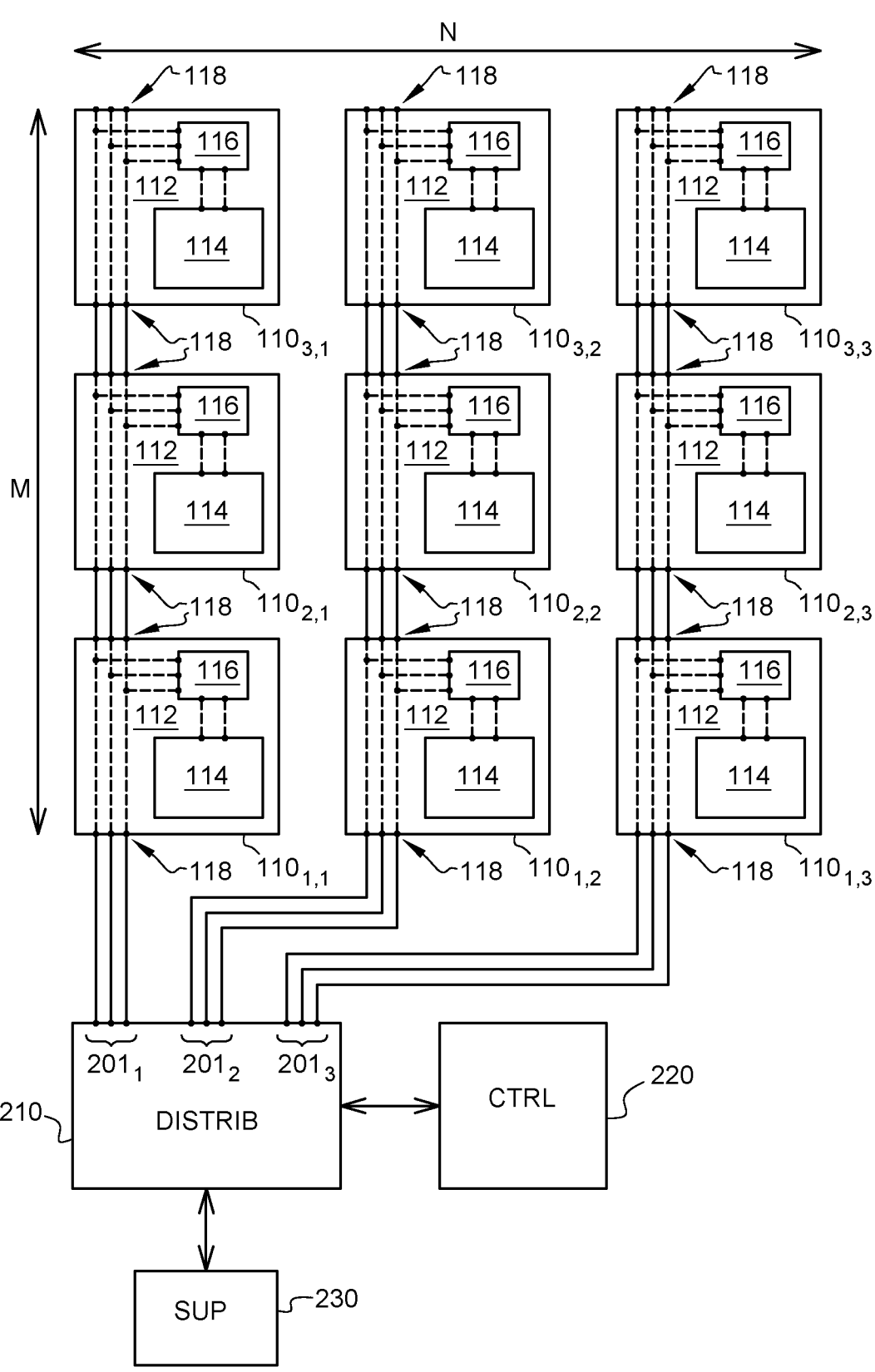
FIG. 7 is a simplified electric diagram of a lighting device with LEDs according to an embodiment.

FIG. 7 is a simplified electric diagram of a lighting device with LEDs according to an embodiment.

It should be noted that, in the above-described examples of lighting structures, whatever the shape of the structure, elementary modules 110 define an array of M row(s) by N column(s) with M an integer greater than or equal to 1 and N an integer greater than or equal to 1. The number M of rows corresponds to the number of stages of the structure. The number N of columns corresponds to the number of elementary modules 110 per stage. Each row is defined by the assembly of the N elementary modules 110 of the corresponding stage. Each column is defined by the assembly of the M elementary modules 110 of same position in the different stages. Thus, the M*N elementary modules 110 define an array screen which may be planar (in the example of FIG. 3) or wound on itself (in the examples of FIGS. 1 and 2).

According to an aspect of an embodiment, an array driving of the lighting structure is implemented, where each elementary module 110, also called pixel, may be individually controlled. FIG. 7 illustrates in further detail an example of a diagram of interconnection of the elementary modules 110 and of peripheral power supply and control circuits of the lighting structure, allowing the implementation of such an array driving.

It should be noted that according to the considered applications, certain elementary modules 110 of the array may be omitted. In other words, it is possible to have an array with holes. In particular, in certain configurations, different columns may have different numbers of elementary modules 110, and/or different rows may have different numbers of elementary modules 110. Those skilled in the art will be able to adapt the driving solutions described hereafter to such configurations.

In this example, a lighting structure of 9 elementary modules 110 distributed in an array of M=3 rows and N=3 columns has been considered. The described embodiments may of course be adapted to any other array dimensions. One will designate hereafter with i, an integer ranging from 1 to M, the rank of the elementary modules in each column, where i=1 corresponds to the bottom module 110 and i=M corresponds to the top module 110 in the column, and with j, an integer ranging from 1 to N, the rank of the elementary modules in each row, where j=1 corresponds to the leftmost module 110 and j=N corresponds to the rightmost module

110 in the row. Further, for simplification, reference $110_{i,j}$ will be used to designate the elementary module 110 of the row i of column j of the array.

In each of the N columns of the array, the elementary modules 110 of the column are coupled in a chain by their respective connectors 118. More particularly, each module $110_{i,j}$, except for top module $110_{M,j}$, is connected, by its top connector 118, to the bottom connector 118 of the module of rank $110_{i+1,j}$ of the same column. The bottom connector 118 of the bottom module $110_{1,j}$ in the column is connected to a connector $201_j$ specific to the column, of an electronic distribution board 210 (DISTRIB). In this example, the top connector 118 of the top module $110_{M,j}$ in the column is not connected.

In this example, each of connectors 118 and $201_j$ is a connector with three terminals. More particularly, two terminals are dedicated to the transmission of a DC voltage for powering modules 110, and the third terminal is dedicated to the transmission of a signal for controlling modules 110, for example, a serialized digital signal.

In each elementary module 110, the printed circuit board 112 of the module comprises three distinct conductive tracks respectively connecting the three terminals of the bottom connector 118 of the module to the three terminals of the top connector 118 of the module. For each column, the connection between the connector $201_j$ of distribution board 210 and the bottom connector 118 of module $110_{1,j}$, and the close-to-close connections between neighboring modules of the column may be performed by means of conductive wires, for example, by means of conductive sheets with three wires or by means of rigid conductors.

In each elementary module 110, the power supply and control circuit 116 of the module receives the power supply and control signals propagated via connectors 118, and accordingly controls the assembly of LEDs 114 of the module.

In this example, the elementary modules 110 of distinct columns are not directly connected to one another.

The device of FIG. 7 further comprises an electronic control board 220 (CTRL), coupled to distribution board 210, particularly adapted to managing and transmitting to distribution board 210 the signals for controlling the elementary modules 110 of the lighting structure. Distribution board 210 and control board 220 are for example formed on two distinct printed circuit boards. Distribution board 210 and control board 220 are for example assembled on the service stage 170 (FIGS. 5 and 6) of the lighting device.

Distribution board 210 may be coupled to a power supply unit 230 (SUP), itself coupled to one or a plurality of electric power sources (not detailed), for example, a DC power source such as an electric battery and/or an AC power source, for example, the mains voltage.

The lighting device may further comprise a user interface device, not shown, coupled to electronic control board 220 by a wired or wireless link. The user interface may for example take the form of an application on a smartphone coupled to electronic control board 220 by wireless communication means.

Figures 8, 9:
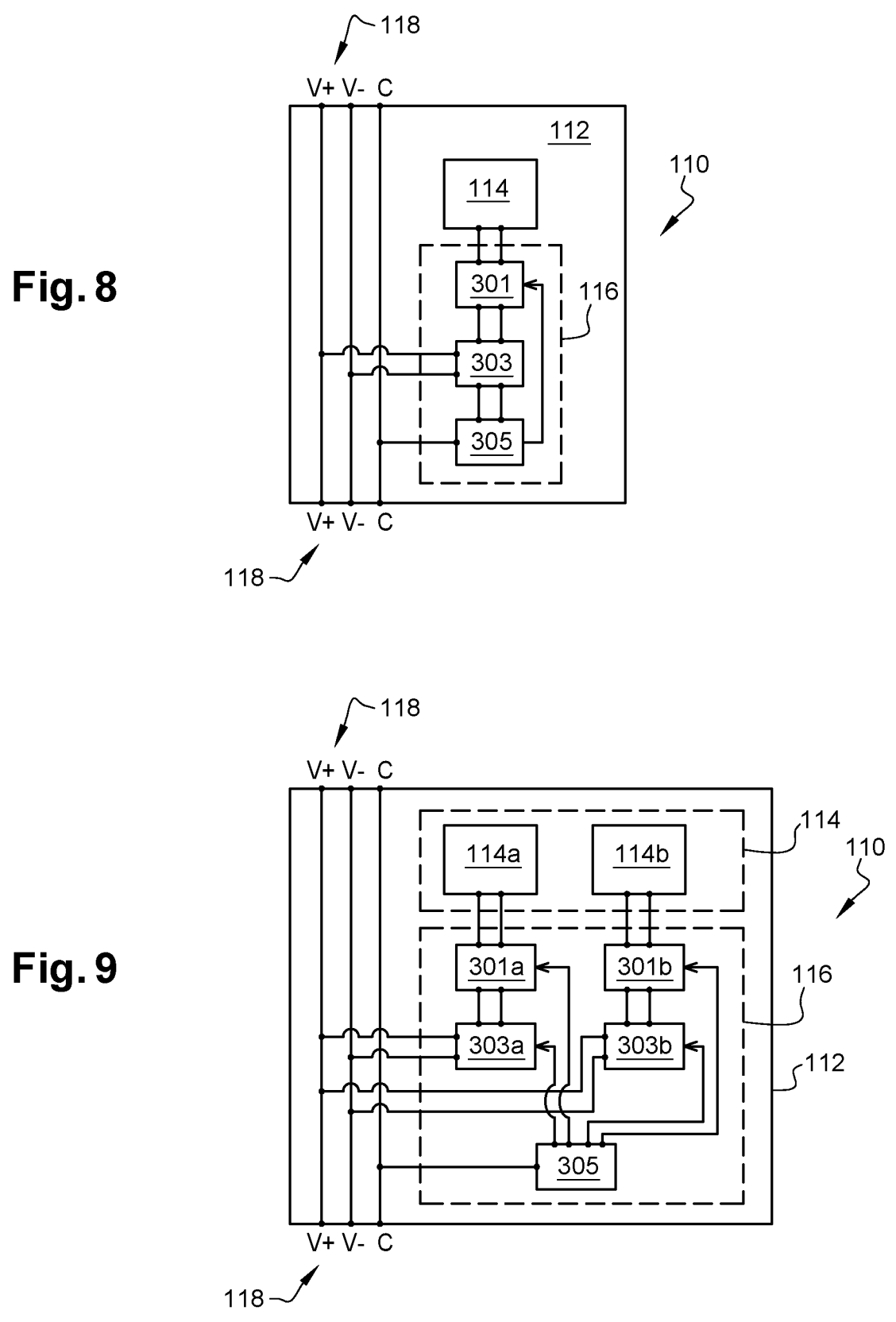

FIG. 8 illustrates in further detail an example of embodiment of an elementary lighting device 110 of the LED lighting device of FIG. 7.

In FIG. 8, the three connection terminals of each connector 118 have been detailed. The V+ and V− terminals respectively correspond to a positive terminal and to a negative terminal of application of the DC power supply voltage of module 110. The potential applied to terminal V− for example corresponds to the reference potential or reference potential of the module. Thus, in an assembly of the type described in relation with FIGS. 1 to 4, the reference terminal (not detailed in the drawings) electrically connected to support structure 130 via the metal part 155 of fastening support 150 is a conductive area or track of printed circuit board 112 connected to the V− terminals of the connectors 118 of the module.

In this example, module 110 is a lighting panel with white LEDs. The same principle may however be applied to color, ultraviolet, infrared LEDs, or to any other light emission wavelength range. LED assembly 114 is formed by a series association of white LEDs (not detailed in the drawing), for example, identical or similar, and comprises two power supply terminals respectively connected to the anode of the first LED and to the cathode of the last LED of the series association.

Power supply and control circuit 116 comprises a power supply circuit 301 and a power switch 303. Switch 303 comprises two input terminals respectively connected to the V+ and V− power supply terminals of module 110, and two output terminals respectively connected to two input terminals of power supply circuit 301. Power supply circuit 301 further comprises two output terminals respectively connected to the two power supply terminals of LED assembly 114.

When switch 303 is in a first state, called on state, the input terminals of power supply circuit 301 are respectively connected to the V+ and V− power supply terminals of the module, so that the power supply voltage of module 110 is applied at the input of power supply circuit 301. Power supply circuit 301 then delivers, between its output terminals, a current or a power supply voltage causing the turning-on of the LEDs. Preferably, power supply circuit 301 is a DC/DC converter with a constant output current, having the advantage of being particularly adapted to the powering of LEDs. As an example, the power supply voltage of module 110 is in the range from 10 to 100 volts, for example, in the order of 50 volts.

When switch 303 is in a second state, called off state, the input terminals of power supply circuit 301 are isolated from the V+ and V− terminals of the module, so that the power supply voltage of the module is not applied to the input of power supply circuit 301. The LEDs are not powered and remain off. In practice, switch 303 may have other functions than the above-mentioned switching function, for example, a function of limitation of the surge current at the start and/or a function of reshaping of the turn-on/turn-off logic, for example to avoid a flash at the powering-on of the product.

In this example, the power supply and control circuit 116 of the module further comprises a control circuit 305, for example, a digital circuit. Control circuit 305 is connected to a control terminal C of module 110. Thus, circuit 305 receives the control signal propagated from close to close in each column of the array of modules 110. Circuit 305 is adapted to interpreting this signal and to accordingly controlling switch 303 and/or power supply circuit 301. As an example, circuit 305 is adapted to controlling switch 303 to the off or on state to turn on or turn off the LEDs of module 110. Circuit 305 may further be adapted to controlling power supply circuit 301 to vary the electric power supplied to the LEDs of assembly 114, and thus vary the light power emitted by the module.

FIG. 9 illustrates an alternative embodiment of the elementary lighting module 110 of FIG. 8.

In this example, LED assembly 114 comprises two sub-assemblies of LEDs 114*a* and 114*b*. The LEDs of sub-assembly 114*a* and the LEDs of sub-assembly 114*b* have different emission properties. As an example, the LEDs of sub-assembly 114*a* are adapted to emitting cold white light, and the LEDs of sub-assembly 114*b* are adapted to emitting warm white light. Each sub-assembly is for example formed of a series association of a plurality of identical or similar elementary LEDs.

Power supply and control circuit 116 comprises two power supply circuits 301*a* and 301*b*, and two power switches 303*a* and 303*b*. Each of switches 303*a* and 303*b* comprises two input terminals respectively connected to the V+ and V− power supply terminals of module 110. Switch 303*a* comprises two output terminals respectively connected to two input terminals of power supply circuit 301*a*. Switch 303*b* comprises two output terminals respectively connected to two input terminals of power supply circuit 301*b*. Power supply circuit 301*a* comprises two output terminals respectively connected to the two power supply terminals of LED sub-assembly 114*a*. Power supply circuit 301*b* comprises two output terminals respectively connected to the two power supply terminals of LED sub-assembly 114*b*.

When switch 303*a* is in a first state, called on state, the input terminals of power supply circuit 301*a* are respectively connected to the V+ and V− power supply terminals of the module. Power supply circuit 301*a* then delivers, between its output terminals, a power supply current or voltage causing the turning-on of the LEDs of sub-assembly 114*a*. Similarly, when switch 303*b* is in a first state, called on state, the input terminals of power supply circuit 301*b* are respectively connected to the V+ and V− power supply terminals of the module. Power supply circuit 301*b* then delivers, between its output terminals, a power supply current or voltage causing the turning-on of the LEDs of sub-assembly 114*b*. Power supply circuits 301*a* and 301*b* are for example DC/DC converters with a constant output current.

When switch 303*a* is in a second state, called off state, the input terminals of power supply circuit 301*a* are isolated from the V+ and V− power supply terminals of the module, so that the LEDs of sub-assembly 114*a* are not powered. Similarly, when switch 303*b* is in the off state, the LEDs of sub-assembly 114*b* are not powered.

In this example, the power supply and control circuit 116 of the module further comprises a control circuit 305, for example, a digital circuit, connected to the control terminal C of module 110. Circuit 305 receives the control signal propagated from close to close in each column of the array of modules 110, and is adapted to accordingly controlling switches 303*a* and 303*b* and/or power supply circuits 301*a* and 301*b*. As an example, circuit 305 is adapted to controlling each of switches 303*a* and 303*b* to the off or on state to turn on or turn off the LEDs of the corresponding sub-assembly 114*a* or 114*b*. Circuit 305 may further be adapted to controlling each of power supply circuits 301*a* and 301*b* to vary the electric power supplied to the LEDs of the corresponding sub-assembly 114*a* or 114*b*. This enables to vary the emitted light power and/or the tone (from warm to cold) of the light emitted by the module. More generally, the above-described solution enables to vary the intensity of each channel, each channel providing a light spectrum defining a shade in a bandwidth ranging from near UV (ultraviolet) to near IR (infrared), spanning the entire visible spectrum.

The variant of FIG. 9 may be adapted to a number of LED sub-assemblies of distinct natures different from two. As an example, LED assembly 114 may comprise a plurality of sub-assemblies adapted to emitting in distinct wavelength ranges, for example, three LED sub-assemblies adapted to respectively emitting mainly blue light, mainly green light, and mainly red light. By modulating the power emitted by the different sub-assemblies, the emission color of the module can thus be controlled.

To individually control the different elementary modules 110 of a same column, the control data of the different modules may be successively transmitted over the column control wire, according to a predetermined sequence. In each lighting module 110, the control circuit 305 of the module knows how to identify the control code which is intended for it. The implementation of an adapted control protocol is within the abilities of those skilled in the art based on the functional indications of the present disclosure and will thus not be described in further detail.

Figure 10:
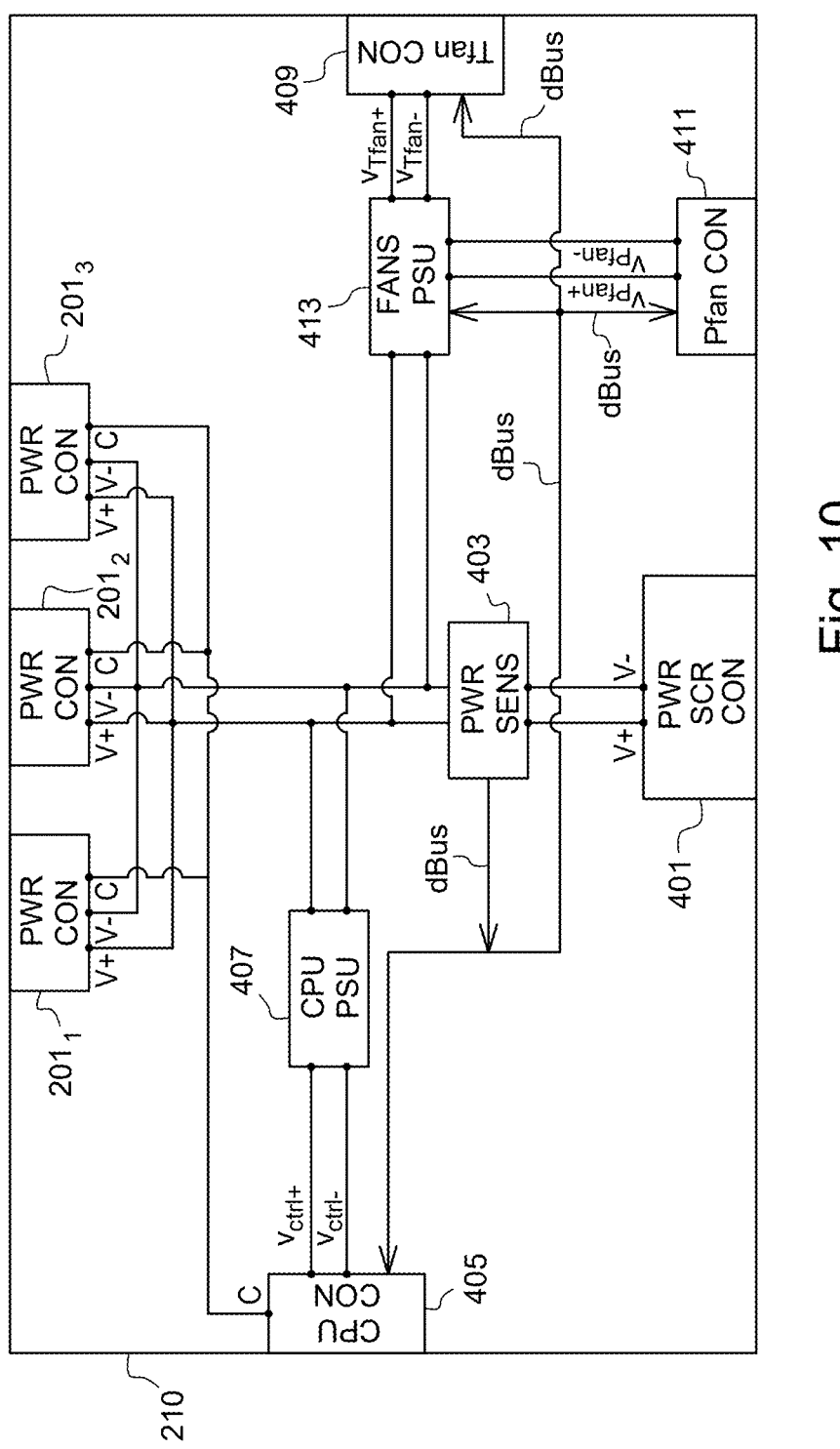
FIG. 10 illustrates an example of embodiment of a power distribution map of a lighting device with LEDs according to an embodiment.

FIG. 10 schematically illustrates an example of embodiment of the distribution board 210 of a lighting device of the type described in relation with FIG. 7.

In the example of FIG. 10, distribution board 210 is adapted to redistributing power supply and control signals from and to different members of the lighting device, among which power supply unit 230 (FIG. 7), control board 220 (FIG. 7), and the array of elementary modules 110 (FIG. 7). In this example, the distribution board is further adapted to distributing power supply and control signals from and/or to heat fan 160 (FIG. 5) and inflation fan 174 (FIG. 5).

In addition to the connectors $201_j$ (PWR CON) intended to be respectively connected to the bottom connectors 118 of the elementary modules $110_{i,j}$ of the different columns, the distribution board 210 of FIG. 10 comprises a main power supply connector 401 (PWR SRC CON) intended to be connected to the power source of the device. Connector 401 comprises two terminals V+ and V− of application of a main DC power supply voltage, respectively coupled, via conductive tracks of card 210, to the V+ and V− power supply terminals of connectors $201_j$. Distribution board 210 may further comprise a multiplexer (not detailed in FIG. 10) adapted to selecting, should the case arise, from among the different available power sources, the power source used to supply the main DC power supply voltage of the distribution board.

In this example, distribution board 210 comprises a power sensor 403 (PWR SENS) connected to the V+ and V− terminals of connector 401, adapted to measuring the electric power drawn from the main power supply terminals V+ and V− of connector 401. As an example, sensor 403 comprises a sensor adapted to measuring the voltage between the V+ and V− terminals of connector 401 and a sensor adapted to measuring the current flowing through the V+ and V− terminals of connector 401.

It should be noted that in the example of FIG. 10, the main DC power supply voltage of the distribution board is directly applied (with no level adaptation) between the V+ and V− terminals of each connector $201_j$.

In the example of FIG. 10, distribution board 210 further comprises a connector 405 (CPU CON) intended to be connected to the electronic control board 220 (FIG. 7) of the lighting device. Connector 401 comprises two terminals $v_{ctrl}+$ and $v_{ctrl}−$ adapted to delivering a DC voltage for powering electronic board 220, for example a voltage lower than the main DC power supply voltage of the distribution board, for example, a voltage in the order of 5 V. Terminals $v_{ctrl}+$ and $v_{ctrl}−$ respectively correspond to a positive terminal and to a negative terminal of application of the DC power supply voltage of the control board. The potential applied to terminal $v_{ctrl}−$ for example corresponds to the reference potential (or ground potential) applied to the V− terminals of connections 401 and $201_j$.

To generate the power supply voltage of control board 220, distribution board 210 further comprises a power supply circuit 407 (CPU PSU), for example, a DC/DC converter, having two input terminals respectively connected to the V+ and V− terminals of connector 401, and two output terminals coupled, for example connected, respectively to terminals $v_{ctrl}+$ and $v_{ctrl}−$.

Connector 405 further comprises a terminal C intended to be connected to a terminal for supplying a signal for controlling control board 220. The terminal C of connector 405 is connected to the terminals C of connectors $201_j$.

In the example of FIG. 10, distribution board 210 further comprises a connector 409 (Tfan CON) intended to be connected to the heat fan 160 (FIG. 5) of the device, and a connector 411 (Pfan CON) intended to be connected to the inflation fan 174 (FIG. 5) of the device.

Connector 409 comprises two terminals $v_{Tfan}+$ and $v_{Tfan}−$ adapted to delivering a DC voltage for powering heat fan 160, for example, a voltage lower than the main DC power supply voltage of the distribution board, for example, a voltage in the order of 24 V. Terminals $v_{Tfan}+$ and $v_{Tfan}−$ respectively correspond to a positive terminal and to a negative terminal of application of the DC voltage for powering the heat fan. The potential applied to terminal $v_{Tfan}−$ for example corresponds to the reference potential (or ground potential) applied to the V− terminal of connector 401.

Similarly, connector 411 comprises two terminals $v_{Pfan}+$ and $v_{Pfan}−$ adapted to delivering a DC voltage for powering inflation fan 174, for example, a voltage lower than the main DC power supply voltage of the distribution board, for example, a voltage in the order of 24 V. Terminals $v_{Pfan}+$ and $v_{Pfan}−$ respectively correspond to a positive terminal and to a negative terminal or application of the DC voltage for powering the heat fan. The potential applied to terminal $v_{Pfan}−$ for example corresponds to the reference potential (or ground potential) applied to the V− terminal of connector 401.

In this example, to generate the voltages for powering the heat fan and the inflation fan, distribution board 210 comprises a power supply circuit 413 (FANS PSU), for example, a DC/DC converter, having two input terminals respectively connected to the V+ and V− terminals of connector 401, two output terminals coupled, for example connected, respectively to terminals $v_{Tfan}+$ and $v_{Tfan}−$, and two output terminals coupled, for example, connected, respectively to terminals $V_{Pfan}+$ and $V_{Pfan}−$.

The distribution board 210 of FIG. 10 further comprises one or a plurality of buses dBUS for transmitting control signals, for example, digital. In the shown example, a control signal transmission bus dBus particularly couples a control port of connector 411 to a data input-output port of connector 405. In this example, a control signal transmission bus dBus further couples a data output port of power sensor 403 to the data input-output port of connector 405. A control signal transmission bus dBus further couples a control port of connector 409 and a control port of power supply circuit 413 to the data input-output port of connector 405.

The forming of the control board 220 of the device of FIG. 7 has not been detailed. Control board 220 may comprise one or a plurality of calculation and processing circuits, for example a microprocessor and/or a microcontroller, and/or one or a plurality of memory circuits.

Figure 11:
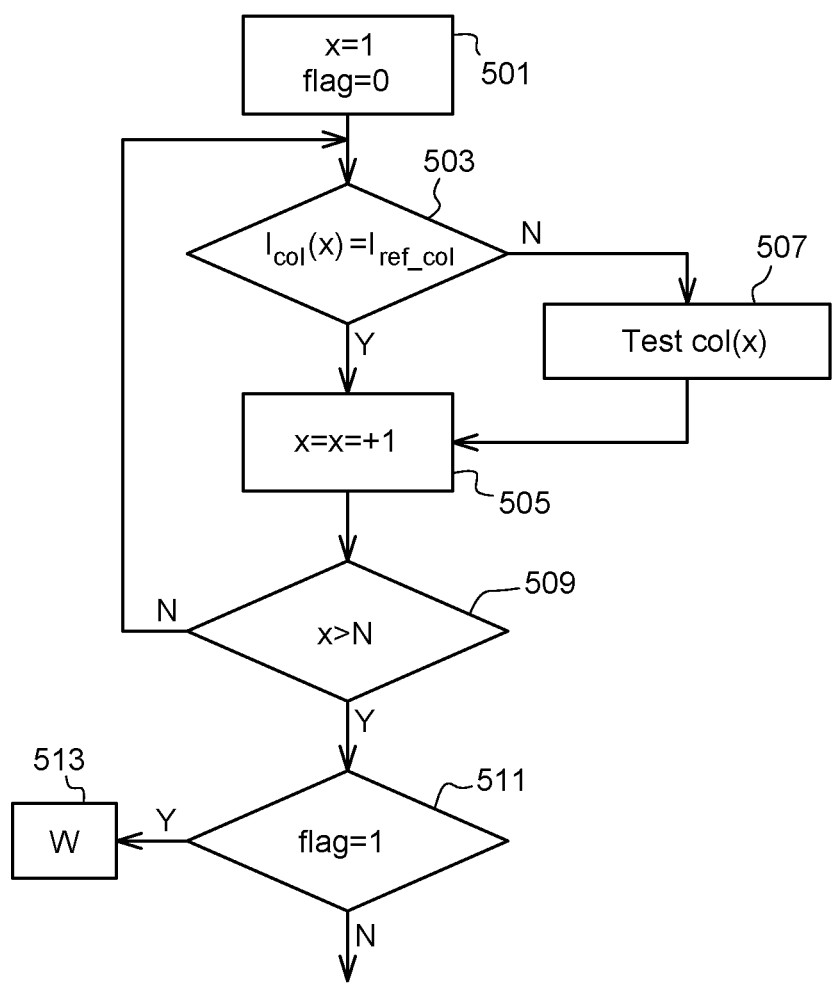
FIG. 11 schematically illustrates in the form of blocks steps of an example of a method of detection of defects in a lighting device with LEDs according to an embodiment.

FIG. 11 schematically illustrates, in the form of blocks, steps of an example of a method of defect detection in a lighting device with LEDs of the above-described type. This method may be implemented at the starting of the lighting device and/or during use, for example, at periodic intervals, and aims at detecting and locating a possibly defective elementary module 110. The method of FIG. 11 may be implemented by means of the electronic distribution and control boards 210 and 220 (FIG. 7) of the device.

The method of FIG. 11 comprises testing one after the other all the columns of the array of elementary modules 110 to identify a possible anomaly in the column and, when an anomaly is detected, testing one after the other all the elementary modules 110 of the column to identify the defective module.

At a step 501, a column index x is initialized at the value of the rank of the first column of the array (x=1). At this step, a defect indicator flag, for example, binary, is initialized at a value corresponding to the absence of defects (flag=0).

At a step 503, the current $I_{col}(x)$ consumed by the column of rank j=x is estimated. For this purpose, all the elementary modules 110 of the columns of rank j different from x are deactivated, that is, controlled to the off state, and all the elementary modules of the column of rank j=x are activated, that is, controlled to the on state. The current flowing between the terminals V+ and V− of connector 401 is then measured by means of power sensor 403. One thus obtains an estimate of the current $I_{col}(x)$ consumed by the column of rank j=x (considering the sum of the currents consumed by the deactivated columns of the array, by the electronic control board, and by the fans, as negligible or known).

During step 503, current $I_{col}(x)$ is compared with a nominal reference value $I_{ref\_col}$, for example stored in a memory circuit of electronic control board 220. Value $I_{ref\_col}$ corresponds to the current normally flowing through a column of the array of elementary modules 110 in the absence of defects in this column.

If, at step 503, the measured current $I_{col}(x)$ is equal or substantially equal (with a predetermined tolerance margin, for example to within plus or minus ten percents) to value $I_{ref\_col}(Y)$, it can be considered that the column operates correctly. In this case, rank x is incremented at a step 505 (x=x+1).

In the opposite case (N), it can be assumed that at least one elementary module 110 in the column is defective. In this case, the elementary modules 110 of the column are tested one by one at a step 507 (Test Col(x)). Examples of implementation of step 507 will be described in further detail in relation with FIGS. 12 and 13. If, at step 507, a module 110 of the column is considered as defective, fault indicator flag is set to a value corresponding to the presence of a defect (flag=1). At the end of step 507, the step 505 of incrementation of rank x is implemented (x=x+1).

After step 505, it is verified, at a step 509, whether all the columns have been tested (x>N). If not (N), steps 503, 507 (if relevant), 505, and 509 are repeated.

If all the columns have been tested (Y), it is determined, at a step 511, whether defect indicator flag is at a value corresponding to the presence of a defect (flag=1). If it is (Y), a warning, for example, a light warning, may be emitted at a step 513 (W). If no defect has been detected (N), the method ends.

Figure 12:
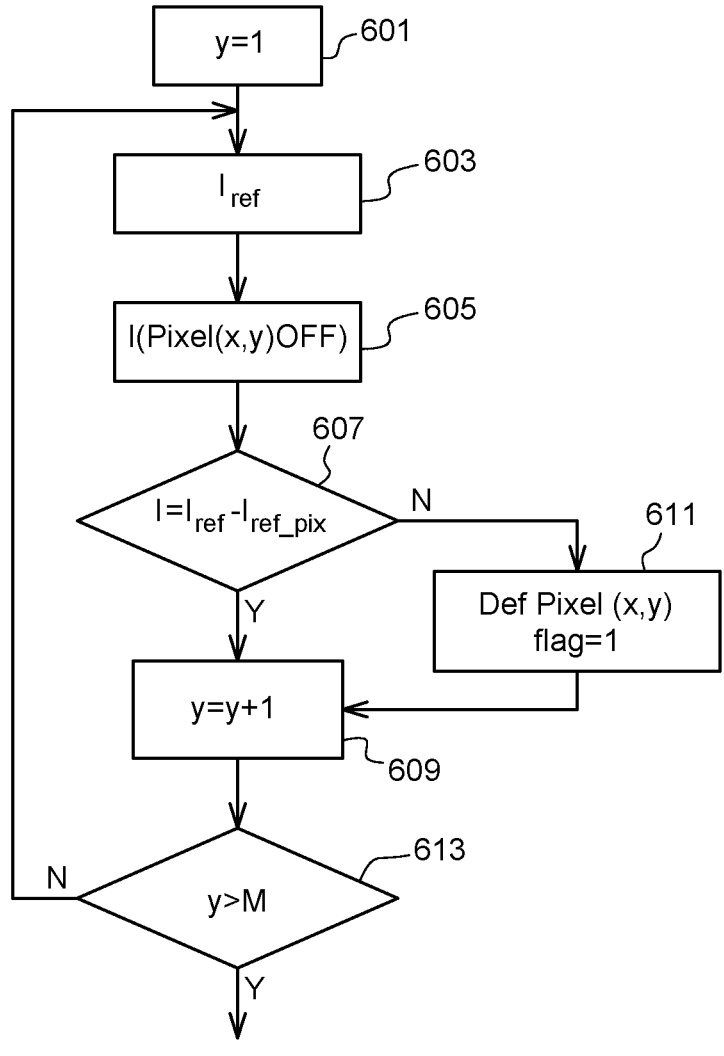
FIG. 12 illustrates in further detail a step of the method of FIG. 11.

FIG. 12 illustrates an example of implementation of step 507 of testing of a column of rank j=x of the method of FIG. 11.

The method of FIG. 12 comprises testing one after the other all the elementary modules 110 of the column of rank j=x to identify a possible defective module.

At a step 601, a row index y is initialized at the value of the rank of the first row of the array (y=1).

Then, at a step 603, all the elementary modules 110 of the array are controlled to the on state. One then measures, by means of sensor 403, a current $I_{ref}$ representative of the total current flowing through the device.

At a step 605, elementary module $110_{y,x}$ is deactivated (controlled to the off state). The other elementary modules 110 of the device remain controlled to the on state, and the total current I flowing through the device is measured by means of sensor 403.

At a step 607, the current I measured at step 605 is compared with the difference between the current $I_{ref}$ measured at step 603 and a nominal reference value $I_{ref\_pix}$, for example stored in a memory circuit of the electronic control board 220. Value $I_{ref\_pix}$ corresponds to the current normally flowing through an elementary module 110 in the absence of defects of the module.

If, at step 607, current I is equal or substantially equal (with a predetermined tolerance margin, for example to within plus or minus ten percents) to value $I_{ref}-I_{ref\_pix}(Y)$, it can be considered that the module operates correctly. In this case, rank y is incremented at a step 609 (y=y+1).

In the opposite case (N), it can be assumed that module $110_{y,x}$ is defective. Defect indicator flag is then set to a value corresponding to the presence of a defect (flag=1) at a step 611. The coordinates of the defective module in the array may further be stored, for example, to be transmitted to a user via a user interface, not detailed. At the end of step 611, step 609 of incrementation of rank y is implemented (y=y+1).

After 609, it is verified, at a step 613, whether all the modules of the column of rank x have been tested (y>M). If not (N), steps 603, 607, 611 (if relevant), 609, and 613 are repeated.

If all the modules of the column have been tested (Y), the column testing step ends.

The method of FIG. 12 is a method of subtractive analysis particularly adapted to the detection of defects generating a decrease in the power consumption of the defective module. It enables to limit to a minimum the turning off of the modules during the test phase, which is particularly advantageous when the test is implemented during the use of the device.

Figure 13:
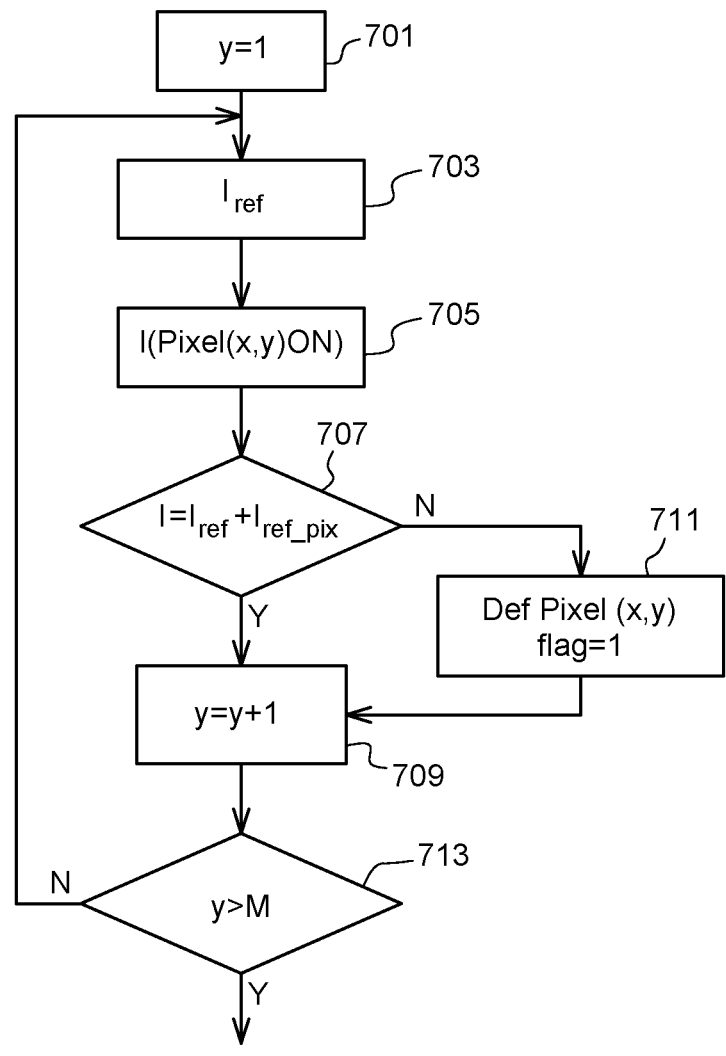
FIG. 13 illustrates an alternative implementation of a step of the method of FIG. 11.

FIG. 13 illustrates another example of implementation of step 507 of testing of a column of rank j=x of the method of FIG. 11.

Here again, all the elementary modules 110 of the column of rank j=x are tested one after the other to identify a possible defective module.

At a step 701, a row index y is initialized at the value of the rank of the first row of the array (y=1).

Then, at a step 703, all the elementary modules 110 of the array except for the elementary modules of the column of rank j=x are controlled to the on state. The elementary modules of the column of rank j=x are all controlled to the off state. One then measures, by means of sensor 403, a current $I_{ref}$ representative of the total current flowing through the device.

At a step 705, elementary module $110_{y,x}$ is activated (controlled to the on state). The other elementary modules 110 of the device remain controlled in the same state as at step 703. The total current I flowing through the device is then measured by means of sensor 403.

At a step 707, the current I measured at step 705 is compared with sum $I_{ref}+I_{ref\_pix}$.

If, at step 707, current I is equal or substantially equal (with a predetermined tolerance margin, for example to within plus or minus ten percents) to value $I_{ref}+I_{ref\_pix}(Y)$, it can be considered that the module operates correctly. In this case, rank y is incremented at a step 709 (y=y+1).

In the opposite case (N), it can be assumed that module $110_{y,x}$ is defective. Defect indicator flag is then set to a value corresponding to the presence of a defect (flag=1) at a step 711. The coordinates of the defective module in the array may further be stored, for example, to be transmitted to a user via a user interface, not detailed. At the end of step 711, step 709 of incrementation of rank y is implemented (y=y+1).

After 709, it is verified, at a step 713, whether all the modules of the column of rank x have been tested (y>M). If not (N), steps 703, 705, 707, 711 (if relevant), 709, and 713 are repeated.

If all the modules of the column have been tested (Y), the column testing step ends.

The method of FIG. 13 is a method of additive analysis particularly adapted to the detection of defects generating an overconsumption of the defective module.

According to the needs of the application, it may be chosen, at step 507 of the method of FIG. 11, to apply one or the other of the methods of FIGS. 12 and 13, or also both, successively.

It should be noted that the reference value $I_{ref\_col}$ used at step 503 (FIG. 11) is selected according to the level of the light power set point applied to the elementary modules during the phase of measurement of current $I_{col}(x)$. Similarly, the reference value $I_{ref\_pix}$ used at step 607 (FIG. 12) or 707 (FIG. 13) is selected according to the level of the light power set point applied to the elementary modules during the phase of measurement of current $I_{ref}$ (step 603 or 703). As an example, electronic control board 220 may store a plurality of reference values $I_{ref\_col}$ and a plurality of reference values $I_{ref\_pixf}$ respectively corresponding to different lighting power set point levels of the elementary modules. For a diagnosis at the start, the elementary modules are preferably controlled at a relatively low luminosity level, for example, lower than 20 percents of their maximum luminosity. In particular, in the case of a lighting balloon with an inflatable envelope, the envelope of the balloon may have not been inflated yet during the diagnosis phase. Performing the diagnosis at a low luminosity level then enables to limit the thermal stress in the device.

More generally, other test strategies than those described in relation with FIGS. 11, 12, and 13 may be implemented, based on consumed power measurements and on the comparison of the measured powers with reference values.

As an example, for a diagnosis in use, a systematic testing of all the modules 110 may be privileged by subtractive analysis, module by module. In other words, the method of FIG. 12 is implemented successively in all the columns of the array, omitting the step of prior selection of suspicious columns (step 503 of FIG. 11). This enables to limit the loss of light flux to the equivalent of a single module 110.

As a variant, for a diagnosis in customer service, a systematic testing of all modules 110 by additive analysis, module by module, may be applied. In other words, the method of FIG. 13 is implemented successively in all the columns of the array, omitting the step of prior selection of suspicious columns (step 503 of FIG. 11). Further, during step 703 of measurement of the reference current, all the elementary modules 110 of the array will be controlled to the off state. This enables to limit the electric power consumption during the test phase.

When a defective module is identified, more advanced complementary tests may be implemented to determine the cause of the failure.

It should further be noted that the diagnosis methods described hereabove in relation with FIGS. 11, 12, and 13 may apply to any lighting device comprising a plurality of elementary modules 110 arranged in a column, including when the support structure of the device is non-conductive and/or does not ensure the function of equipotentiality of the reference potentials of the different elementary modules 110.

Figure 14:
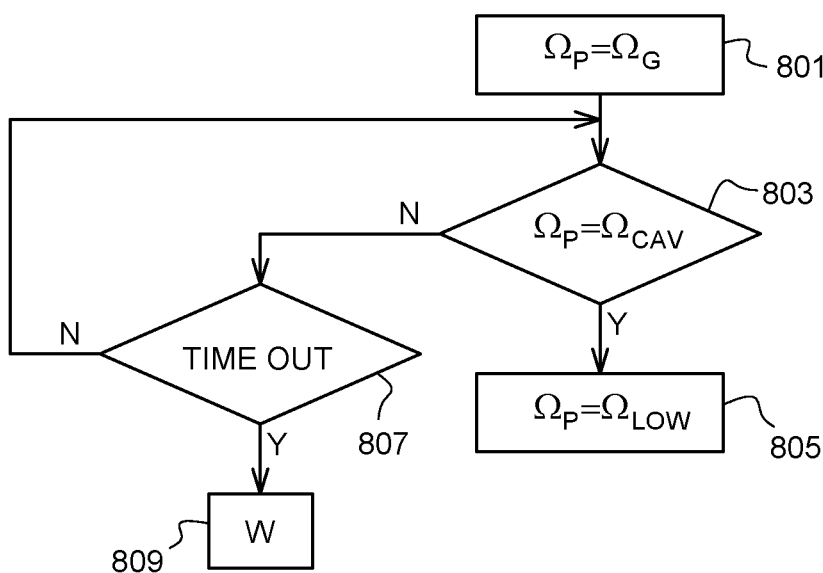
FIG. 14 schematically illustrates in the form of blocks an example of a method of control of the inflation of an envelope of a lighting balloon with an inflatable envelope according to an embodiment.

FIG. 14 schematically illustrates, in the form of blocks, an example of a method of controlling the inflation of an envelope of a lighting balloon having an inflatable envelope according to an embodiment. This method may be implemented at the putting into service of the device, during the inflation of the envelope. The method of FIG. 14 may for example be implemented by means of the electronic distribution and control boards 210 and 220 (FIG. 7) of the device.

In this example, the inflation fan 174 of the device is a variable-speed fan comprising a control data input/output port, coupled to the electronic control board 220 via a data, for example, digital, bus dBus of distribution board 210. The input/output port for controlling fan 174 particularly comprises one or a plurality of input terminals adapted to receiving a set point signal for the fan supply power. The input/output port for controlling the fan further comprises one or a plurality of output terminals adapted to delivering a return signal representative of the effective rotation speed of the fan, measured by means of a rotation speed sensor (not detailed in the drawings) integrated to the fan.

Before the inflation phase, the envelope is initially deflated and the inflation fan is stopped.

At a step 801, the fan is controlled to its inflation power, for example, to its maximum power to obtain a fast inflation of the envelope. All along the inflation phase, the fan injects air into the envelope of the balloon. During this phase, the effective rotation speed $\Omega_F$ of the fan is maintained at an inflation value $\Omega_G$, for example, substantially constant, which depends on the applied power set point.

At the end of the inflation phase, that is, when the envelope is filled with air, the air pressure inside of the balloon settles at a value slightly greater than the outer pressure. The air flow displaced by the fan is then decreased. This results in an increase in the rotation speed of the fan (for a given power set point). It is said that the fan starts cavitating.

According to an aspect of an embodiment, it is provided to monitor the effective rotation speed of the fan to detect the cavitation and deduce therefrom that the inflation of the balloon is finished.

At a step 803, the effective rotation speed $\Omega_P$ of the fan is measured by electronic control board 220. Card 220 determines whether the measured speed $\Omega_P$ corresponds to a cavitation speed $\Omega_{CAV}$, greater than inflation speed $\Omega_G$.

If the cavitation is detected at step 803 (Y), the fan power set point is decreased at a step 805. The rotation speed $\Omega_P$ of the fan is thus taken down to a value $\Omega LOW$, for example, lower than value $\Omega_G$. This enables to maintain a substantially constant pressure in the balloon during the phase of use, while limiting the electric power consumption and the noise of the fan.

If the starting of the cavitation is not detected at step 803 (N), it is verified at a step 807 (TIME OUT) whether the time elapsed since the beginning of the inflation phase does not exceed a predefined threshold, corresponding to a maximum nominal inflation time.

If it is determined at step 807 that the maximum inflation time has not been exceeded (N), steps 803 and, if relevant, 807, may be repeated, for example, at regular time intervals.

If it is determined at step 807 that the maximum inflation duration has been exceeded (Y), it can be deduced that the envelope may have an air leak and a warning is emitted for the user at a step 809 (W).

The method described in relation with FIG. 14 has the advantage of allowing a simple detection of the end of the inflation phase, and, should the case arise, of a possible leak in the envelope of the balloon.

Other control and/or diagnosis methods based on an analysis of a fan speed feedback signal may be implemented by electronic control board 220. As an example, a detection of an abnormally high rotation speed (for a given power set point) may enable to determine that an air intake filter of the fan is clogged. A warning message may then be emitted for the user, to notify them that the filter has to be cleaned. A defect of the fan may further be detected if it is observed that the effective rotation speed Q of the fan is not consistent with the applied power set point. Here again, a warning may be emitted to the user. If a failure of the inflation fan is detected, a securing of the device may be activated. For example, elementary modules 110 may be controlled at a low power, for example, in the order of 10% of their maximum power, to avoid a possible degradation of the envelope under the effect of the heat emitted by the LEDs.

The different warnings sent to the user may be transmitted via a user interface device (not detailed) of the lighting device, for example, via a contactless communication channel, for example, a radio wave communication channel (for example, of Bluetooth type), for example, towards a mobile terminal of smartphone type or to a remote maintenance facility. As a variant, the warnings may be emitted in the form of light signals, for example, predefined sequences of successive flashes emitted by means of one or a plurality of elementary modules 110 of the device.

It should be noted that the method of FIG. 14 is not limited to an implementation in an array lighting device with LEDs of the above-described type. More generally, this end-of-inflation detection method of FIG. 14 may be adapted to any lighting balloon comprising an inflatable envelope and an inflation fan. In particular, this method may be adapted to balloons integrating other types of lighting structures than those described hereabove, for example, structures based on incandescent lamps.

Various embodiments and variants have been described. Those skilled in the art will understand that certain features of these various embodiments and variants may be combined, and other variants will occur to those skilled in the art. In particular, the described embodiments are not limited to the examples of numerical values or to the examples of materials mentioned in the present disclosure.

Further, in the examples of assembly described in relation with FIGS. 1 to 5, fastening support 150 may be replaced with any other element adapted to ensuring both the function of mechanical fastening of elementary modules 110 to support structure 130, and the function of electric connection of reference terminals of printed circuit boards 112 to support structure 130, to ensure the equipotentiality between the reference terminals of the different modules 110. As an example, the fastening support may be replaced with clamps, each provided with a conductive part connecting a reference terminal of printed circuit board 112 to support structure 130.

The invention claimed is:

1. A lighting device comprising:
   an electrically-conductive support structure; and
   a plurality of elementary lighting modules fastened to the support structure, each elementary module comprising a printed circuit board and, assembled on the printed circuit board, a LED assembly and an electronic circuit for powering and controlling the LED assembly,
   wherein, in each elementary module, the printed circuit board of the module comprises at least one reference terminal, the reference terminals of the printed circuit boards of the different elementary modules being electrically connected to one another via the support structure,
   wherein the elementary modules are arranged according to a plurality of columns, each comprising a plurality of elementary modules, each module comprising two power supply and control connectors, and the elementary modules of a same column being connected in a chain via their respective power supply and control connectors.

2. The device according to claim 1, wherein each elementary module comprises a support for fastening-the module to the support structure.

3. The device according to claim 2, wherein, in each elementary module, the module fastening support comprises an electrically-conductive part electrically connecting a reference terminal of the printed circuit board of the module to the support structure.

4. The device according to claim 3, wherein said electrically-conductive part comprises a conductive rod provided at its ends with conductive tabs, each comprising an opening crossed by a conductive rod of the support structure.

5. The device according to claim 2, wherein each elementary module further comprises a transparent or translucent protection casing placed in front of the printed circuit board of the module, the protection casing being fastened to said support for fastening the module.

6. The device according to claim 1, wherein the elementary modules are arranged according to one or a plurality of prism-shaped stages, the modules being arranged on the lateral surfaces of the prism.

7. The device according to claim 1, wherein the elementary modules are arranged according to a planar layout.

8. The device according to claim 1, further comprising an electronic power supply and control circuit connected to an end of each column.

9. The device according to claim 8, wherein the electronic power supply and control circuit is configured to implement a diagnosis method comprising a step of measurement of a quantity representative of at least one of a current consumed by a column or of a voltage across a column of elementary modules.

10. The device according to claim 8, wherein the electronic power supply and control circuit is configured to implement a diagnosis method comprising the following steps:
   a) controlling an elementary module of a column to the on state and measuring a value representative of the current flowing through the column;
   b) controlling said elementary module of said column in the off state and measuring a value representative of the column flowing through the column; and
   c) comparing the difference between the value measured at step a) and the value measured at step b) with a nominal reference value and, if the interval between said difference and said nominal reference value exceeds a determined margin, deducing therefrom that said elementary module is defective.

11. The device according to claim 1, comprising a diffusing envelope surrounding the support structure and the elementary modules.

12. The device according to claim 11, wherein the diffusing envelope is an inflatable envelope.

* * * * *